(12) United States Patent
Mahoney et al.

(10) Patent No.: US 7,138,811 B1
(45) Date of Patent: Nov. 21, 2006

(54) SEALS USED FOR TESTING ON AN INTEGRATED CIRCUIT TESTER

(75) Inventors: David M. Mahoney, San Jose, CA (US); Mohsen Hossein Mardi, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/174,156

(22) Filed: Jul. 1, 2005

(51) Int. Cl.
*G01R 31/02* (2006.01)
(52) U.S. Cl. .................. 324/754; 324/765; 324/158.1
(58) Field of Classification Search ........ 324/754–762, 324/765, 158.1
See application file for complete search history.

(56) References Cited

U.S. PATENT DOCUMENTS

| 4,771,234 A | * | 9/1988 | Cook et al. | 324/754 |
| 6,420,885 B1 | * | 7/2002 | Fredrickson | 324/754 |
| 6,703,852 B1 | * | 3/2004 | Feltner | 324/754 |

* cited by examiner

*Primary Examiner*—Ernest Karlsen
*Assistant Examiner*—Arleen M. Vazquez
(74) *Attorney, Agent, or Firm*—Kim Kanzaki

(57) ABSTRACT

A system for reducing condensation during testing of an integrated circuit is disclosed. An exemplary embodiment includes two seals which close both ends of an enclosed channel formed when the load board is secured to the device tester. Clean dry air with a pressure greater than that of the environment is feed into the enclosed channel and is trapped because of the seals.

20 Claims, 10 Drawing Sheets

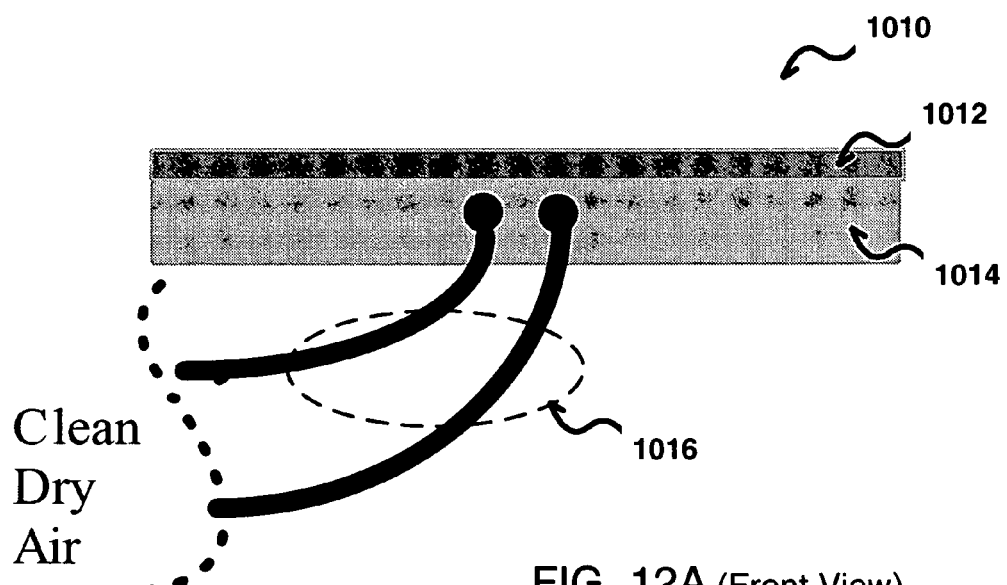
FIG. 12A (Front View)
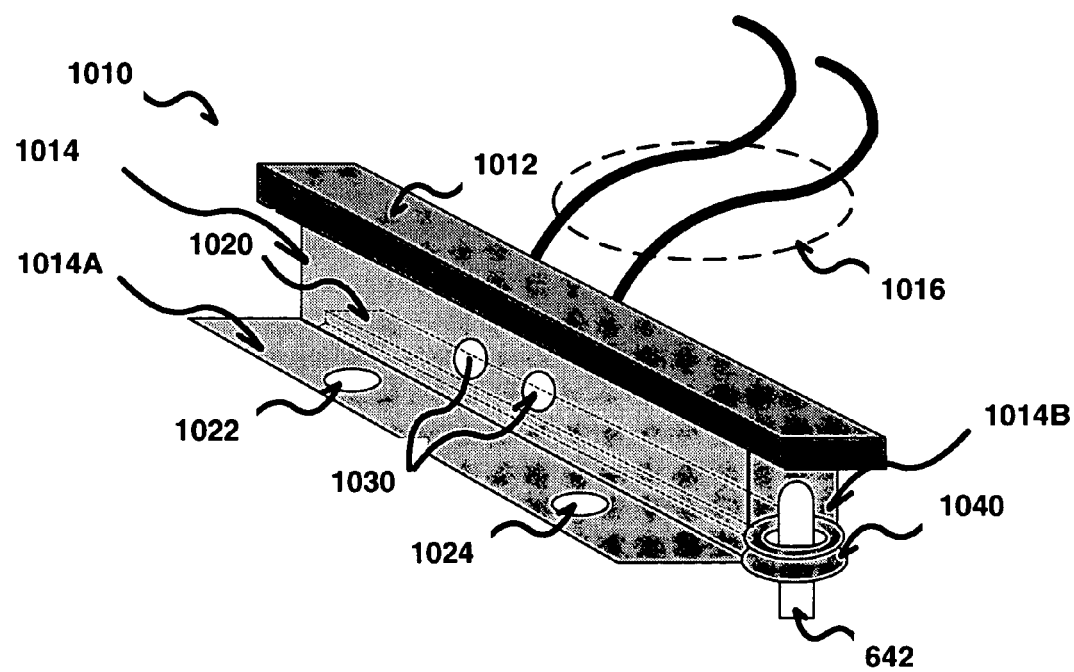
FIG. 12B (Back View)

SEALS USED FOR TESTING ON AN INTEGRATED CIRCUIT TESTER

FIELD OF THE INVENTION

The present invention relates generally to integrated circuit testing.

BACKGROUND

FIG. 1 is an exploded perspective view showing a conventional ATE system 100, which represents a typical system utilized to test packaged integrated circuits (ICs) prior to sale to an end user. Conventional ATE system 100 includes an IC test signal generator (device tester) 110 (partially shown), a load board 120, a docking plate 130, and an automated handler (not shown) for mounting IC DUTs onto load board 120. Briefly described, the handler associated with ATE system 100 moves an IC DUT from a shipping tray (not shown) onto a test socket 127 that is mounted on load board 120. Alternatively, this process may be done by hand (i.e., manually). Testing is then carried out by transmitting electrical signals from device tester 110 to an IC DUT through test socket 127, and processing test data returned from the IC DUT in response to the applied test signals. This testing process is typically used to identify non-functional ICs.

Referring to the lower portion of FIG. 1, device tester 110 is an expensive piece of computing equipment that includes a base unit (partially shown) having a test surface 112 located at one end. Extending from test surface 112 are a first platform 140 having a first group 113 of compressible test ("pogo") pins arranged in a first column, and a second platform 150 having a second group 115 of compressible test pins arranged in a second column that is parallel to the first column such that a central channel 117 is defined between first and second platforms 140 and 150. A blow-up of an example set of pogo pins is shown as 113-1. Not shown in order to simplify the description are the seals which surround the compressible test pins 113 and 115 (see for example, seals 142 and 152 of FIG. 5). Also extending from test surface 112 are several connection bolts 119 that are used to secure load board 120 to device tester 110. An example of conventional device testers that are consistent with device tester 110 is the Integra J750 Test Family, which is produced by Teradyne, Inc. of Boston Mass., USA.

Located above device tester 110 is load board 120, which is a printed circuit board (PCB) having a lower surface 121 facing test surface 112 and an upper surface 122 facing away from test surface 112, and includes a first plurality of test contacts 123, a second plurality of test contacts 125, and one or more test sockets 127. First test contacts 123 are arranged in a first column, and each test contact includes a contact pad located on lower surface 121 such that each contact pad abuts the tip of a corresponding compressible pin of first group 113 when load board 120 is mounted onto device tester 110. Similarly, contact pads of second test contacts 125 are arranged on lower surface 121 in a second column such that each test contact abuts the tip of a corresponding compressible pin of second group 115. Test sockets 127 are mounted on upper surface 122, and include pins or other contact structures that are connected to corresponding first and second test contacts 123 and 125 by conductive traces (wires) 128, which are formed in accordance with known practices. Finally, load board 120 is secured to device tester 110 using connectors 129 that receive the ends of bolts 119 and hold load board 120 such that the compressible pins of first group 113 are firmly pressed against the contact pads of first test contacts 123, and such that the compressible pins of second group 115 are firmly pressed against the contact pads of second test contacts 125.

Shown above load board 120 is docking plate 130, which is a rigid (e.g., aluminum) structure that is fixed (e.g., screwed) to upper surface 122 of load board 120, and includes openings 135 that mount over test sockets 127.

FIG. 2 is a cross-sectional side view showing conventional ATE system 100 with docking plate 130 mounted on load board 120, and load board 120 fastened to device tester 110. Note that compressible test pins of each group 113 and 115 are electrically connected to the DUT via corresponding conductive traces 128, and receive test signals from a central processing unit (CPU) 210. As indicated in the lower portion of FIG. 2, compressible pin groups 113 and 115 are mounted on a support plate 220 that has sufficient strength to resist the downward force from the compressible pins of groups 113 and 115 when load board is fastened onto the ends of bolts 119. As indicated previously, the seals surrounding compressible pin groups 113 and 115 are not shown in order to simplify the explanation.

As indicated at the top of FIG. 2, during testing, docking plate 130 functions to prevent bending of load board 120, which is subjected to a downward force P that is needed to press a DUT against test socket 127. Downward force P is used to provide the necessary connection between the contact structures of test socket 127 and contact structures (e.g., solder balls or bumps) formed on a lower surface of the DUT.

Low-temperature semiconductor device testing is often used to verify the conformance of a semiconductor device such as an IC with military specifications. During low-temperature testing, semiconductor devices are placed in a special low-temperature box containing a cool dry environment maintained at a temperature in the range of, e.g., 0° C. to −58° C., and a handler that moves the cooled semiconductor devices between a loading tray and a test socket that is coupled to a device tester.

FIG. 3 is an exploded perspective view and a simplified cross-sectional side view showing a portion of a conventional low-temperature testing arrangement 300 that utilizes test system 100 (described above). The conventional low-temperature testing arrangement 300 generally includes device tester 110, a low-temperature handler system 350, and load board 120, which connect between device tester 110 and handler system 350 during low-temperature testing procedures. Low-temperature handler system 350 includes an insulated box 352 connected to a cooling system (not shown), and a device handling mechanism (handler) 355 mounted inside of insulated box 352. An opening 357 is provided in a side wall of insulated box 352 through which test sockets 127 of handler board 120 are exposed to the cool dry environment maintained inside insulated box 352. Device handling mechanism 355 (partially shown) is an expensive precise robot including an arm for moving a DUT from a storage location (e.g., a shipping tray) to the test socket 127 during test procedures. The storage location is also inside of insulated box 352 so that the DUTs are maintained at a desired low temperature throughout the test procedures. Conventional systems meeting the description of low-temperature handler system 350 are produced, for example, by Delta Design of San Diego, Calif., USA.

A major problem associated with conventional low-temperature testing arrangement 300 is that, during low temperature testing, the low temperature of the DUT can cause condensation to form on the back surface 121 of load board 120. The potential for condensation is particularly high on the back surface 121 of load board 120 opposite test sockets 127 because of the cold temperatures conducted along contact structures 128 (see FIG. 2) from the cooled DUT. This condensation can cause a short circuit between any traces 128 or related contact structures that are exposed on back surface 121, thereby producing erroneous test signals.

What is needed is a structure for the low-temperature testing arrangements described above that reduces condensation during low temperature testing.

SUMMARY

The present invention includes a system for reducing condensation during testing of an integrated circuit. An exemplary embodiment of the present invention includes two seals which close both ends of an enclosed channel formed when the load board is secured to the device tester. Clean dry air with a pressure greater than that of the environment is feed into the enclosed channel and is trapped because of the seals. In this embodiment the seal formed by the two seals is not airtight so that some air leaks out. In an alternative embodiment an airtight seal can be used when there are enough holes in the board to allow some air flow.

One embodiment of the invention has a system for integrated circuit testing. The system includes a support structure with a first substantially rectangular platform having a first group of test pins, and a second substantially rectangular platform having a second group of test pins, such that a channel is formed between the first and second substantially rectangular platforms; a dry air source configured to provide dry air to the channel; and a seal having a substantially rectangular shaped middle portion and tapered end portions; and wherein at least part of seal is interposed between the first and second substantially rectangular platform and is configured to close at least part of one end of the channel.

A second embodiment of the invention has a system for semiconductor device testing comprising, device tester including a support plate. The support plate includes a first substantially rectangular platform having a first group of test pins, and a second substantially rectangular platform having a second group of test pins, wherein the first and second substantially rectangular platforms are located such that a channel is formed between them. The system further includes a board positioned above the first and second substantially rectangular platforms and enclosing the channel; a dry air source configured to provide dry air to the enclosed channel; and two substantially rectangular shaped plugs, where each substantially rectangular shaped plug has tapered ends; and wherein each rectangular-shaped plug is configured to close at least part of one end of the enclosed channel such that the dry air is substantially contained in the enclosed channel.

Yet another embodiment of the invention includes a tester system for semiconductor device testing. The system includes: a base having a support plate and a channel between a first and second potion of the support plate, where the first portion has a first sealing ring and a first group of compressible test pins therein and the second portion has a second sealing ring and a second group of compressible test pins therein; a load board mounted over the first and second sealing rings and including first and second pluralities of test pin contacts formed on a first surface facing the base, and a device test socket mounted on a second surface facing away from the base, wherein the device test socket is located between the first and second groups of test pin contacts, and wherein when the first plurality of test pin contacts abut the tips of the first group of compressible test pins, and the second plurality of test pin contacts abut the tips of the second group of compressible test pins, the channel is enclosed; and a boxed shaped structure having at least two ends narrowed in at least one dimension, the box shaped structure closing one end of the enclosed channel, where examples of the boxed shaped structure are an outer edge seal, a plug, or like structures.

The present invention will be more full understood in view of the following description and drawings.

BRIEF DESCRIPTION OF THE DRAWINGS

These and other features, aspects and advantages of the present invention will become better understood with regard to the following description, appended claims, and accompanying drawings, where:

FIGS. 12A and 12B show a front view and back view, respectively, of a simplified seal 1010 of an embodiment of the present invention.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention.

Figure 4:
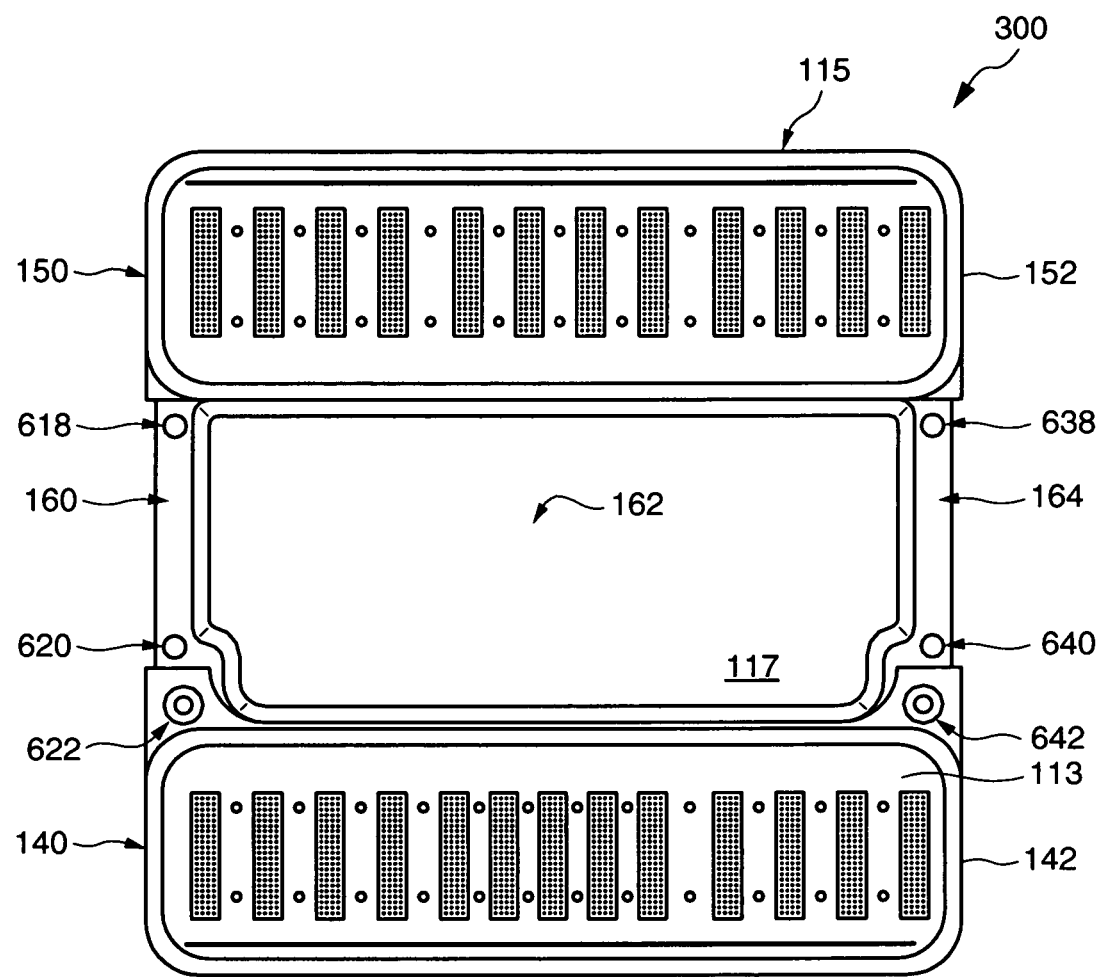
FIG. 4 is a top view of a portion of a semi-conductor device tester.

FIG. 4 is a top view of a portion of a semi-conductor device tester, which is used with an embodiment of the present invention. The labels in FIG. 4 correspond to those in FIG. 7 and are explained below with regard to FIG. 7. One example length and width of the device tester shown in FIG. 4 is about 13.3 inches by 13.4 inches. An example width of channel 117 is about 5 inches. The depth of the recessed area 162 is about 0.83 in. and the height from the bottom of the recessed are to the top of the platforms 140 and 150 is about 1.165 in. These measurements are for illustration purposes only and dimensions vary from device tester to device tester.

Figure 5:
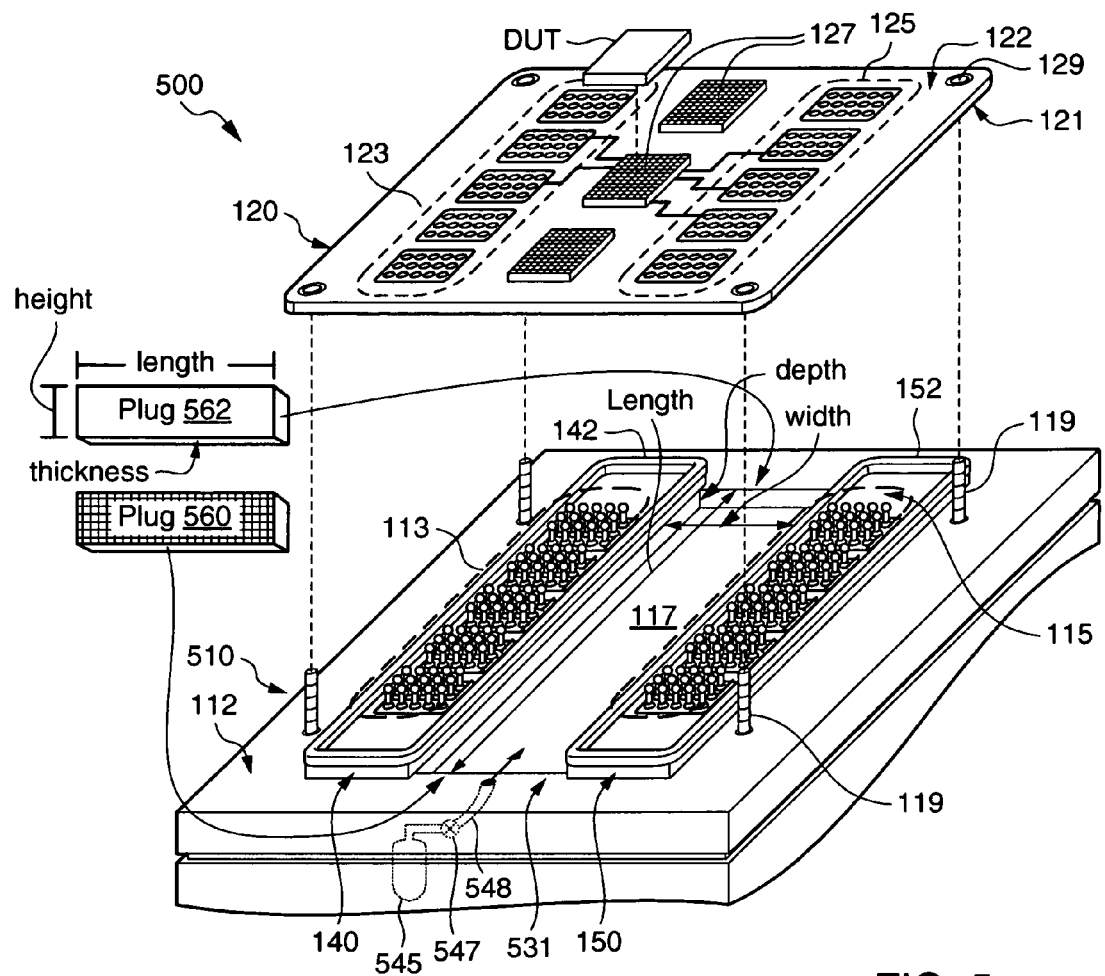
FIG. 5 is an exploded perspective view showing a portion of a simplified ATE system that is modified to include multiple plugs according to one embodiment of the present invention.
Figure 6:
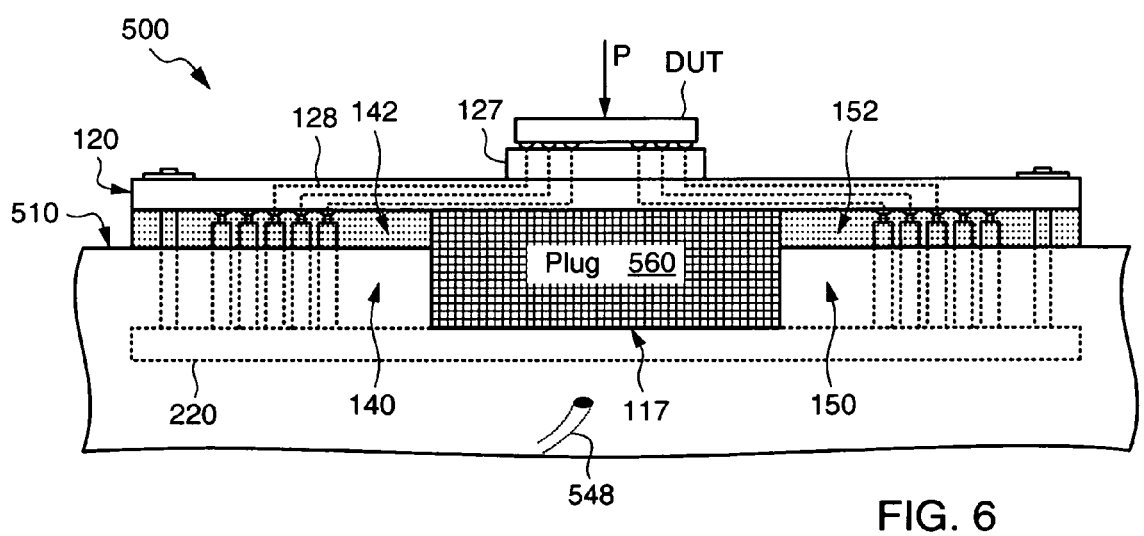
FIG. 6 is a side cross-sectional view showing a portion of the simplified ATE system of FIG. 5.

FIGS. 5 and 6 are a perspective view and a simplified cross-sectional side view showing an ATE system 500 for testing semiconductor devices according to a first embodiment of the present invention. Similar to conventional system 100 (discussed above), ATE system 500 includes an IC device tester (base) 510 (partially shown), a load board 120, and a conventional automated handler (not shown) for mounting IC DUTs onto load board 120. Aside from the modifications described below, device tester 510 and load board 120 operate as described above with reference to device tester 110 and load board 120 of conventional system 100. Accordingly, structures of device tester 510 and load board 120 are identified with similar reference numbers, and detailed description of these structures is omitted below for brevity.

In accordance with an embodiment of the present invention, device tester 510 is modified to include pipe 548 coupled to a source of dry gas 545 via a valve 547 in order to provide the dry gas to the channel 117. In the simplified illustrated embodiment, plug 560 (likewise plug 562) is a three-dimensional rectangular structure with a length about equal to the width of the channel 117. In other embodiments plug 560 (likewise plug 562) is a three-dimensional rectangular shaped structure whose length is greater that the width of the channel 117 and whose lengthwise ends are tapered. In one embodiment a tapered end includes a concave shape.

As shown in FIG. 6, when load board 120 is secured to device tester 510, load board 120 will make contact with first sealing ring 142, which is at the edge of platform 140 and surrounds the first group of compressible test pins 113, and with second sealing ring 152, which is at the edge of platform 150 and surrounds the second group of compressible test pins 115. One example of the sealing ring is found on the Teradyne J750 device tester (see FIG. 4). The attached load board 120 will enclose the channel 117 forming a duct which is open on both ends. The purpose of the two outer edge seals or plugs 560 and 562 is to close both ends of the duct, hence forming a closed chamber. In one embodiment dry air with a dew point of −100 degrees Fahrenheit or below and above one atmosphere pressure is provided to the closed chamber in order to significantly reduce condensation during low temperature testing of the one or more ICs. In another embodiment the dew point may be above −100 degrees Fahrenheit as long as the gas is reasonably dry, and the gas pressure need only be greater than the external pressure so that gas flows outward, when the seal is not air-tight.

As indicated in FIG. 6, according to a first embodiment of the present invention, plugs 560 and 562 are constructed to reduce or prevent bending of load board 520 during test operations. Plug 562 (and likewise plug 560) have length, height, and thickness as shown in FIG. 5. In this embodiment the plugs 560 and 562 are formed from a rigid, preferably non-conducting material, and have a thickness that provides sufficient strength to resist the downward bending of load board 520 during all types of DUT testing operations. In an alternative embodiment, the plugs 560 and 562 are made in two layers, with first layer from the same material as the device tester 510 (for example, aluminum) and a second layer from the same material as the sealing rings 142 and 152.

According to a second embodiment of the present invention, outer edge seals 560 and 562 are constructed to form a closed chamber from channel 117 when load board 120 is mounted onto device tester 510, which is then used to provide a dry gas environment on lower surface 121 of load board 120 opposite to test sockets 127. In this embodiment the outer edge seals 560 and 562 are formed from a flexible, preferably non-conducting material, and have a narrow or sheet-like thickness in order to maintain the dry gas environment. In this embodiment an outer edge seal includes a narrow 3-D rectangular like structure and one or more layers. The 3-D rectangular like structure is configured to be mounted at the outer edge of channel 117. Thus in one example, the 3-D rectangular like structure includes three cylindrical like structures (e.g., see the cylindrical like structures surround holes 618 and 620 and alignment pin 622 for outer edge seal 810 in FIG. 9) attached on the inside surface of flat and narrow 3-D rectangular like structure is configured to be mounted on the outer edge of channel 117. As indicated in FIG. 5, one or more pipes or tubes 548 are formed in, for example, end wall 531 to facilitate the selective passage of dry gas (e.g., dry air) into channel 117 from a source (e.g., gas canister) 545 via a control valve 547.

As indicated in FIG. 6, when load board 120 is mounted onto device tester 510, load board 120 makes contact with platform seals 142 and 152. Load board 120 forms an ceiling that along with plug 560 (and plug 562 not shown) encloses channel 117 to form a closed chamber. Subsequently, when dry cool gas from source 545 is pumped into chamber 535, the dry cool gas prevents condensation from forming on back surface 121 opposite test sockets 127, thereby preventing short-circuit conditions that can lead to erroneous test data.

Figure 7:
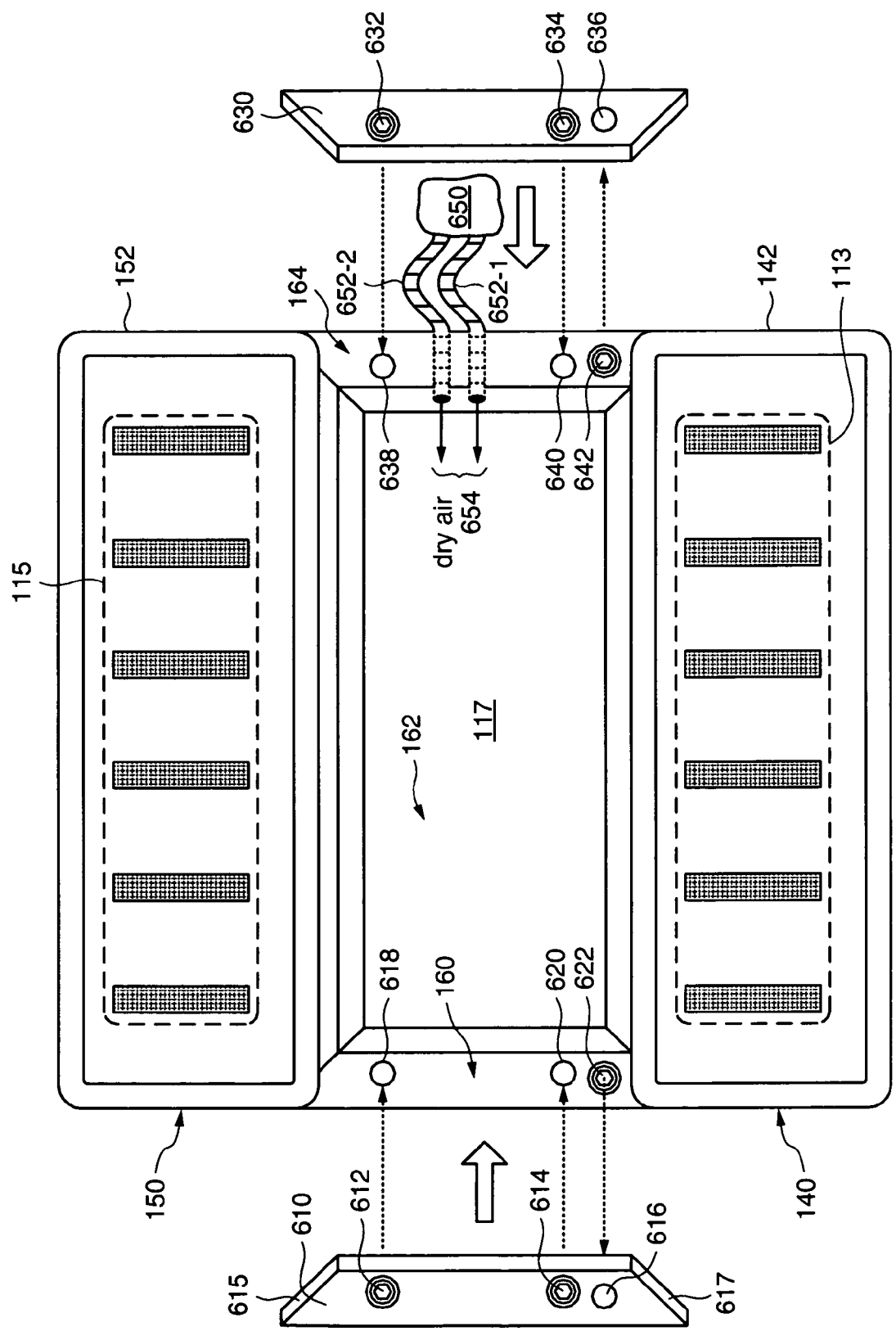
FIG. 7 shows a simplified schematic of another an embodiment of the present invention.

FIG. 7 shows a simplified schematic of another an embodiment of the present invention. The seals 610 and 630 are trapezoidal in shape. Seal 610 has a two bolt like objects 612 and 614 than fit into holes 618 and 620, respectively, where holes 618 and 620 may be threaded. An alignment pin or bolt 622 fits into hole 616, which may or may not be threaded. Seal 610 is configured to make contact with ledge 160, i.e., a non-recessed area of channel 117. Similarly, seal 630 has a two bolt like objects 632 and 634 than fit into holes 638 and 640, respectively, where holes 638 and 640 may be threaded. An alignment pin or bolt 642 fits into hole 636, which may or may not be threaded. Seal 630 is configured to make contact with ledge 164, i.e., a non-recessed area of channel 117. As illustrated in FIG. 7 channel 117 has three parts: a recessed portion 162, a first non-recessed portion 160 and a second non-recessed portion 164.

In FIG. 7 a dry, clean gas is supplied via a source 650 via tubes 652-1 and 652-2 to supply dry air 654 to channel 117 when it is enclosed by seals 610 and 630 and load board 120 (not shown). While seal 610 (and/or likewise seal 630) is illustrated as trapezoidal in shape, in other embodiments the ends 615 and 616 of seal 610 may have a curved like structure, in one case concave, in order to make a better seal with platforms 140 and 150, including platform seals 142 and 152. In one embodiment seal 610 (and likewise seal 630) are made of FR-4. In another embodiment seal 610 (and likewise seal 630) are composed of two layers, where the top layer which makes contact with the platform seals 142 and 152 is made of silicon foam and the bottom layer which makes contact with the more rigid body of platforms 150 and 140 is made of FR-4.

Figure 8:
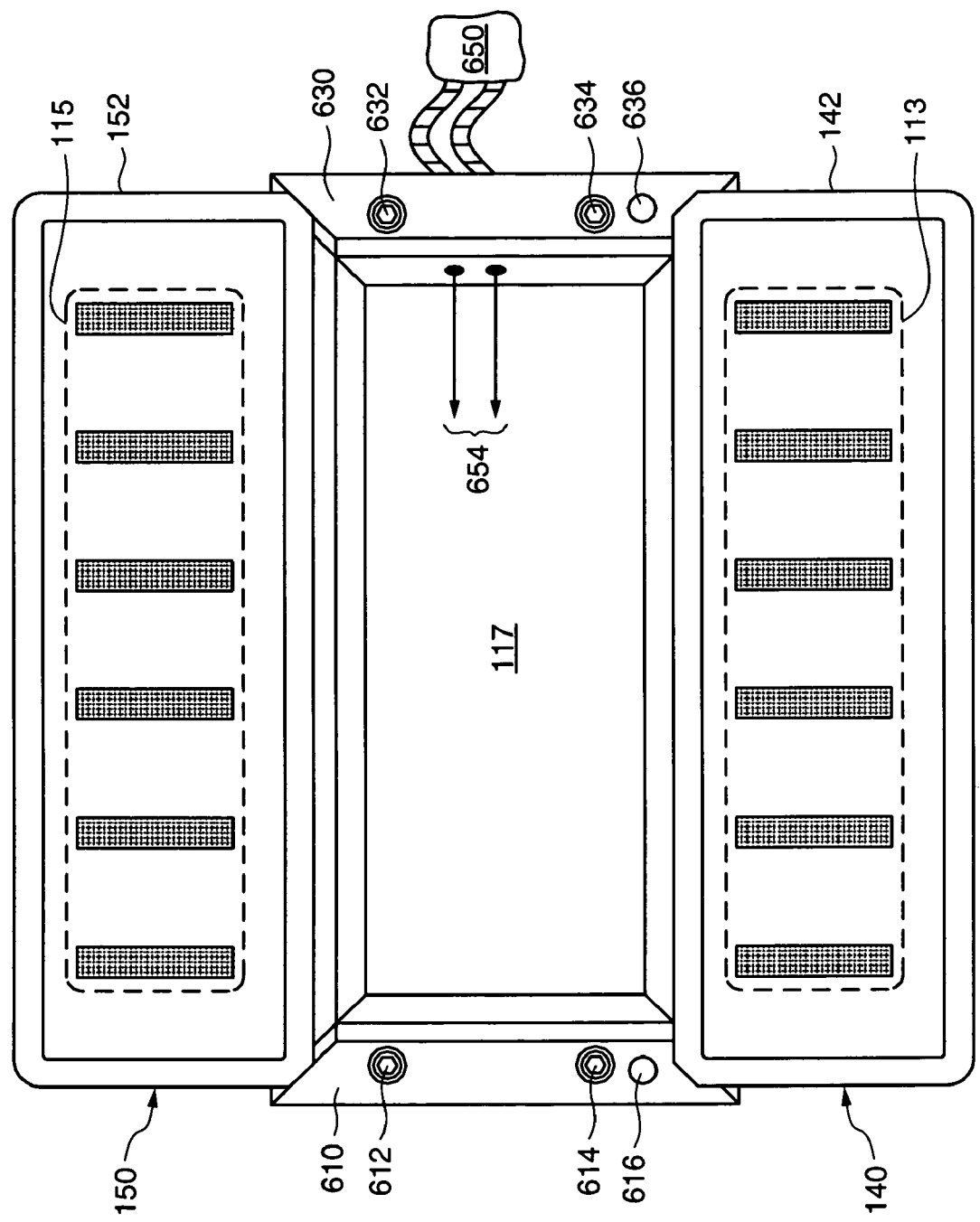
FIG. 8 illustrates the attachment of the seals of FIG. 7 to the test device.

FIG. 8 illustrates the attachment of seals 610 and 630 of FIG. 7 to the test device 510. As shown both ends of the recessed portion 162 of channel 117 are closed in a non-air-tight seal. The load board 120 will form the top of the chamber having the recessed portion 162 of channel 117. In an alternative embodiment the enclosed chamber is substantially air-tight.

Figure 9:
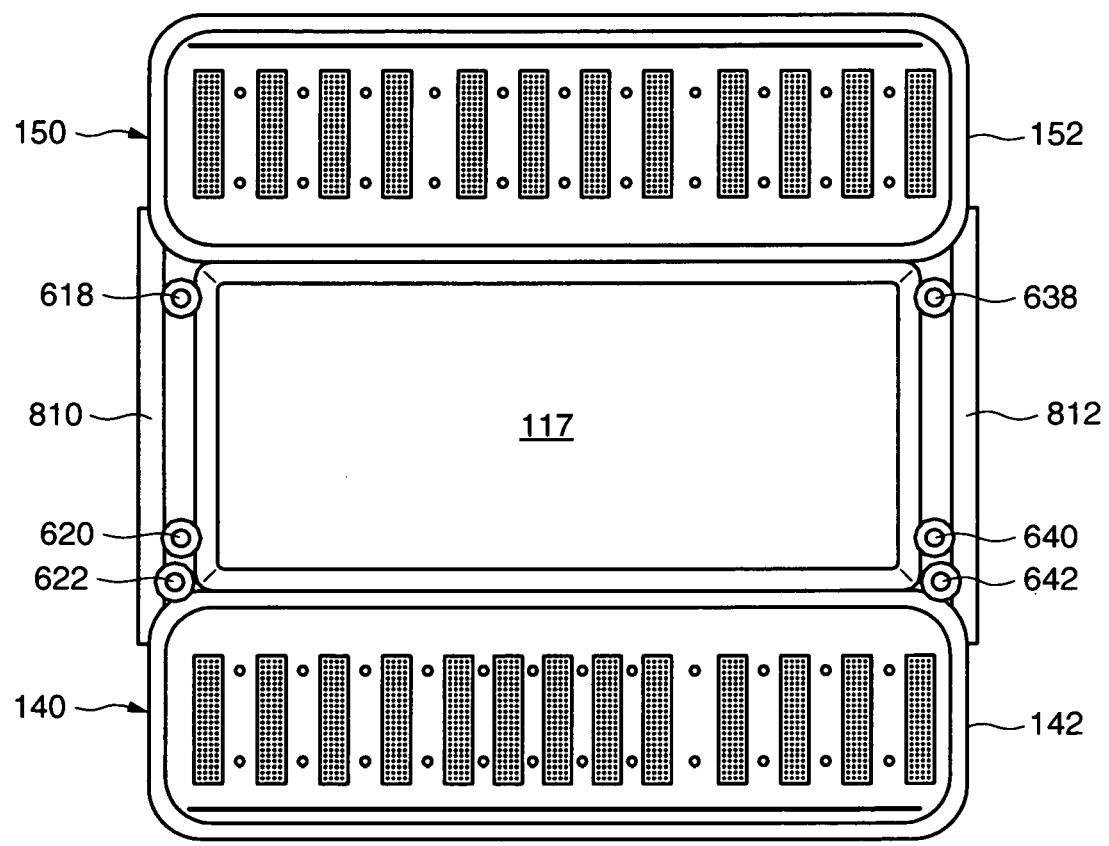
FIG. 9 is an illustration of FIG. 4 with the two end seals of an embodiment of the present invention.

FIG. 9 is an illustration of FIG. 4 with the two end seals 810 and 812 of an embodiment of the present invention. In this embodiment the seals 810 and 812 are made of a fiberglass layer (about 0.932 inches high and 5 inches in length) with a silicon foam layer on top (about 0.3 inches in height and 5 inches in length). The seals 810 and 812 would only contact the outer edge of the load board 120 and have a thickness of about ½ inch.

Figure 1:
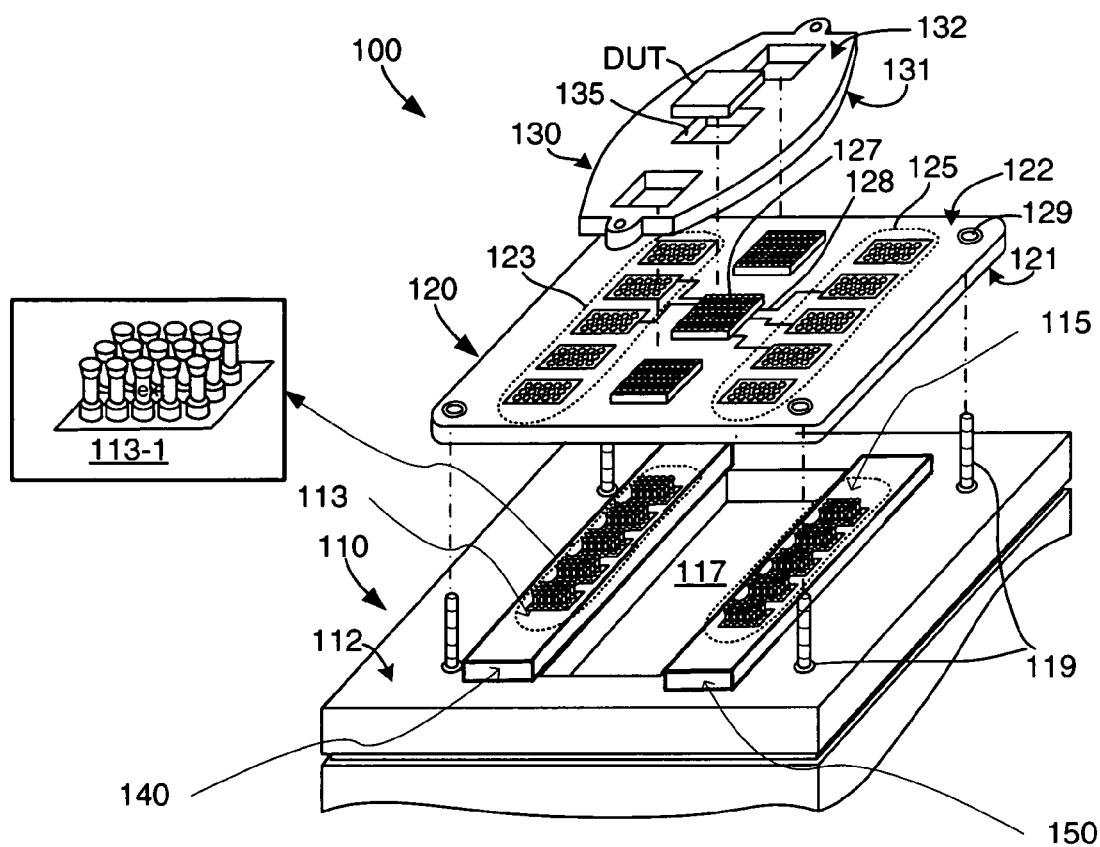
FIG. 1 is an exploded perspective view showing a portion of a conventional ATE system.
Figure 2:
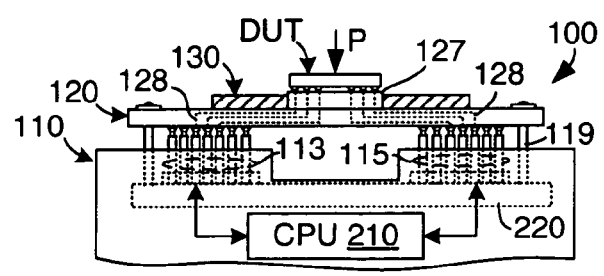
FIG. 2 is a side cross-sectional view showing the conventional ATE system of FIG. 1.
Figure 3:
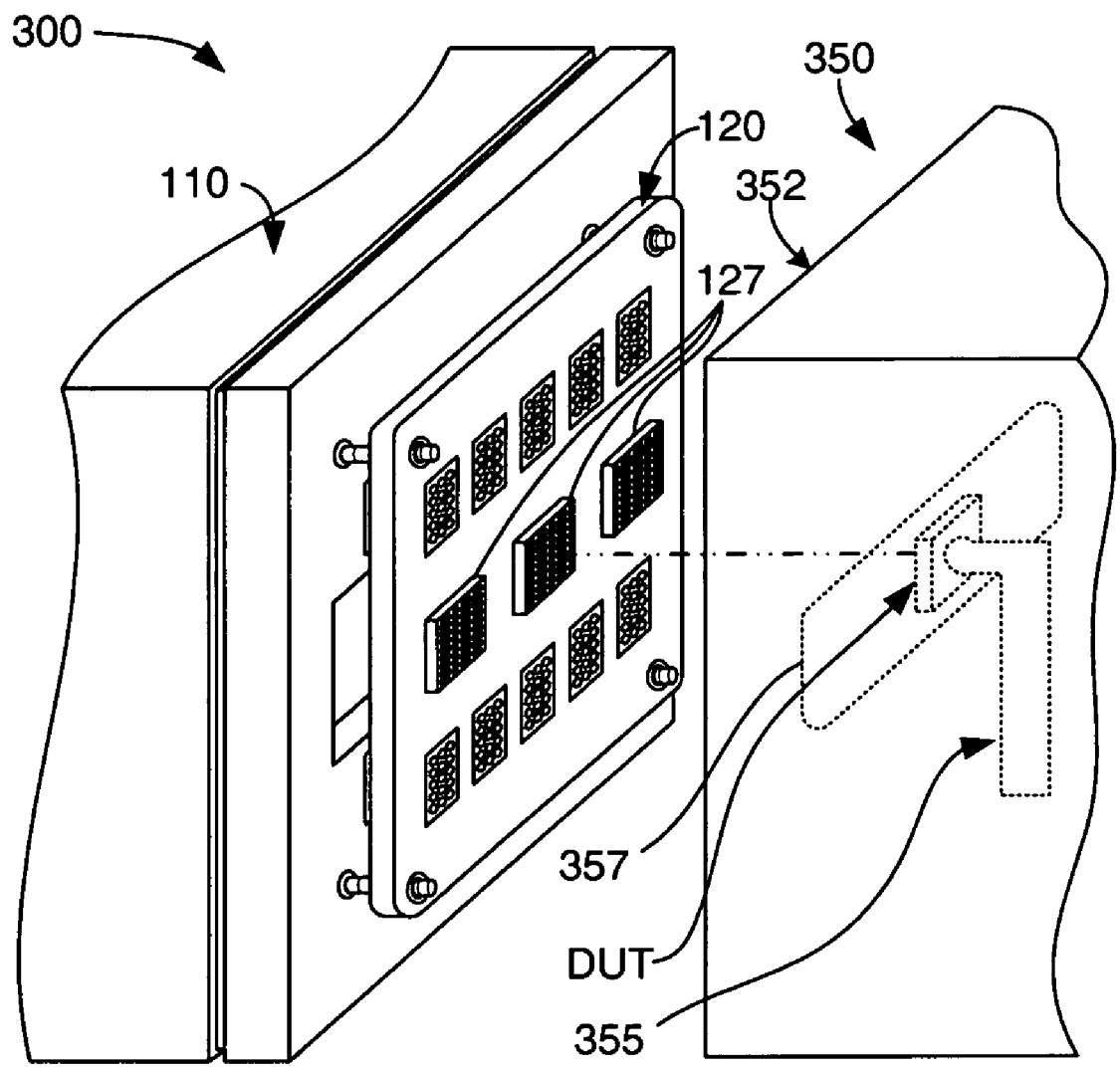
FIG. 3 is an exploded perspective view showing a low-temperature test assembly including a handler interface apparatus and the conventional ATE system of FIG. 1.
Figure 10:
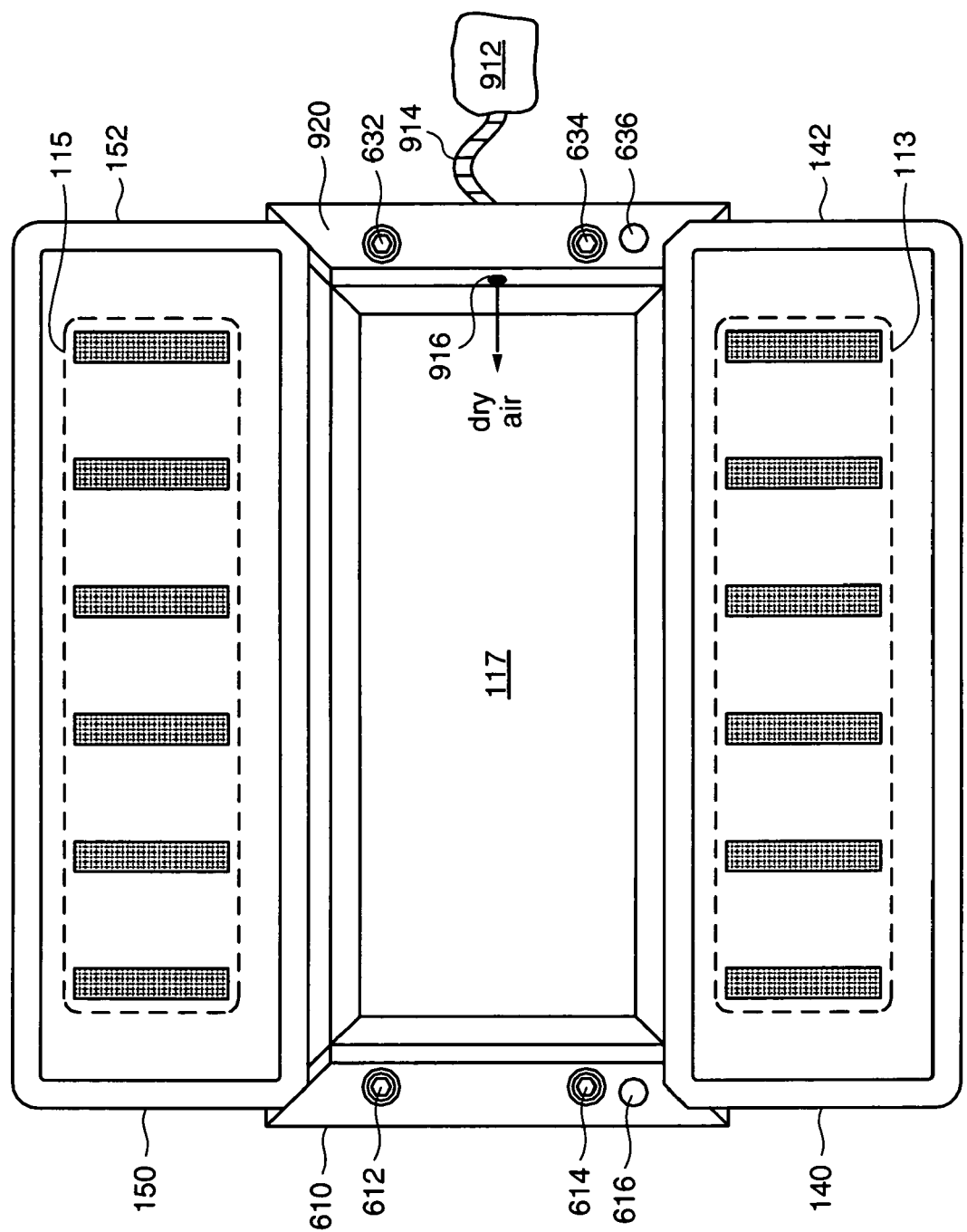
FIG. 10 shows yet another embodiment of the present invention with the seals attached to the testing device of FIG. 1.

FIG. 10 shows yet another embodiment of the present invention with the seals 610 and 920 attached to the testing device 110 of FIG. 1. Here there is no modification of the testing device 110. The seal 920 has a hole 916 connected to dry air supply 912 via hose 914 in order to supply air to the enclosed chamber.

Figure 11:
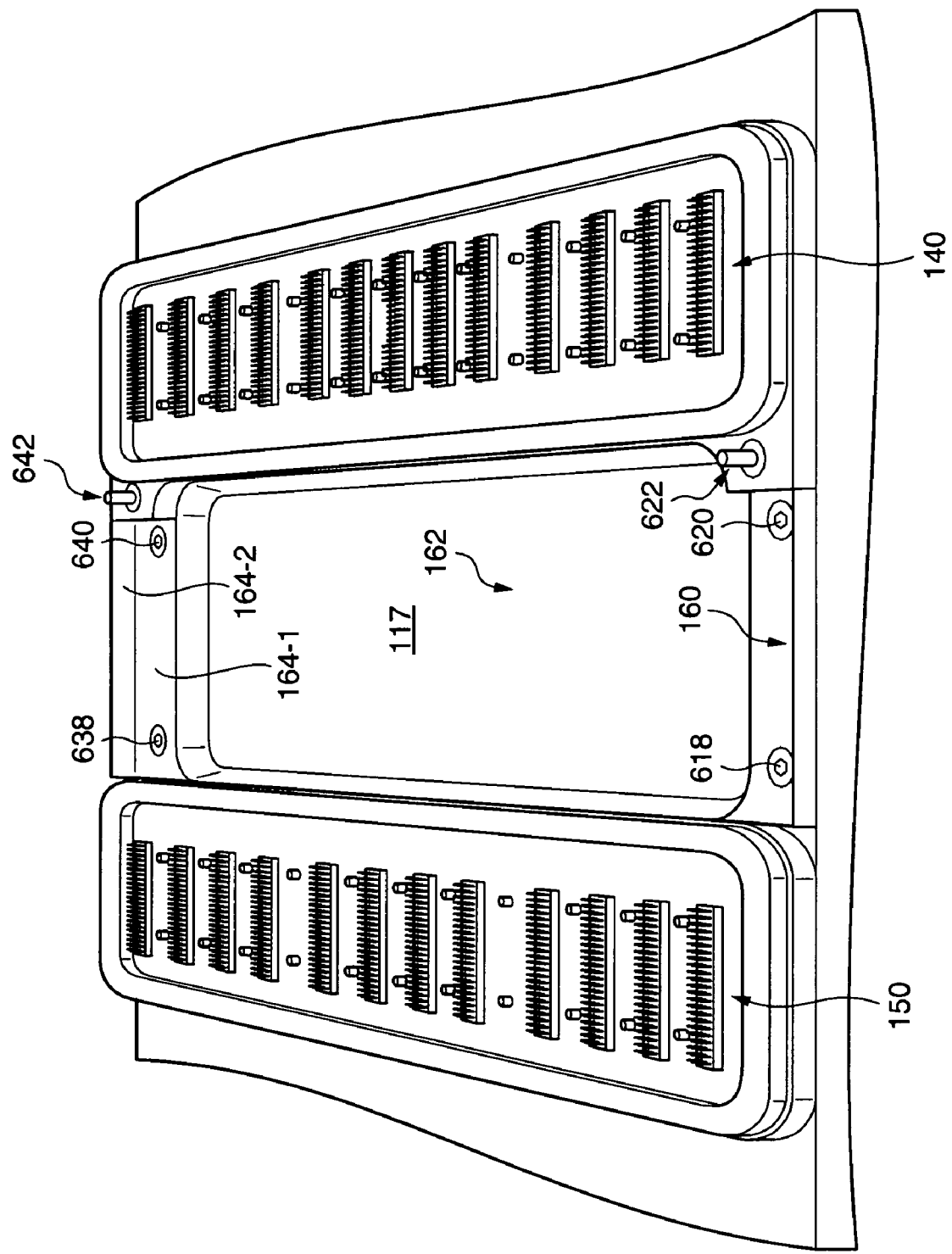
FIG. 11 is a top view of a portion of the Teradyne J750 semi-conductor device tester.

FIG. 11 is a top view of a portion of the Teradyne J750 Semi-conductor device tester. The same labels used in FIG. 7 are used in FIG. 11 to represent the same or similar items. Like FIG. 7, FIG. 9 has a recessed portion 162 of channel 117. Unlike FIG. 7, the non-recessed portion has two parts arranged in a step like fashion, a first non-recessed portion 164-1 and a higher second non-recessed portion 164-2. Also as illustrated in FIG. 11, alignment pin 622 may be on a non-recessed portion of channel 117 above non-recessed portion 160. Other embodiments of the device tester may have various non-recessed portions in various combinations and heights above recessed portion 162.

FIGS. 12A and 12B show a front view and back view, respectively, of a simplified seal 1010 of an embodiment of the present invention. FIG. 12A shows a front view of a two layer seal 1010 with the top layer 1012 having sealing foam and the bottom layer having a Printed Circuit Board (PCB) material such as FR-4. Two hoses 1016 attached to layer 1014 provide the clean dry air to the channel 117. With reference to FIGS. 7, 11 and 12A, in FIG. 12b where the items are similar or the same, the same reference numbers are used. In FIG. 12B the bottom layer 1014 of seal 1010 includes a first part 1014A having the two holes 1022 and 1024 which are to be aligned with holes 638 and 640 respectively, in FIG. 11, where the flat first part 1014A is configured to be attached to the non-recessed (or partially recessed) portion 164-1 via the holes 1022–1024. The bottom layer 1014 further includes a 3D rectangular second part 1014B having two air holes 1030 for the air hoses 1016 and having a small 3D rectangular section 1020 removed from the base of part 1014B in order that the part 1014B can sit on top of non-recessed portion 164-2 in FIG. 11. In another embodiment rectangular portion 1014B is thin enough to fit above the non-recessed (or partially recessed) portion 164-2. The seal 1010 further includes a rubber like or silicon foam or other flexible material donut 1040 which fits over alignment pin 642 and which may or may not be attached to part 1014B of the seal 1010. The donut 1040 is shown smaller than what is needed for ease of illustration, and should be of a size to form a seal (air tight or nearly air tight) between the platform seal 140 of FIG. 11 and second part 1014B of seal 1010.

Although the invention has been described in connection with several embodiments, it is understood that this invention is not limited to the embodiments disclosed, but is capable of various modifications, which would be apparent to one of ordinary skill in the art. For example, while some of embodiments have shown that channel 117 has a recessed portion and a non-recessed portion, in other embodiments channel 117 has no recessed portion. In addition, while some embodiments of the invention have been described in the context of low temperature testing, the scope of the invention includes any other testing where an enclosed gas filled chamber under a load board is needed. Thus, the invention is limited only by the following claims.

What is claimed is:

1. A system for integrated circuit testing comprising:
    a support structure comprising, a first substantially rectangular platform having a first group of test pins, and a second substantially rectangular platform having a second group of test pins, such that a channel is formed between the first and second substantially rectangular platforms;
    a dry air source configured to provide dry air to the channel; and
    a seal having a substantially rectangular shaped middle portion; and
    wherein at least part of seal is interposed between the first and second substantially rectangular platforms and is configured to close at least part of one end of the channel.

2. The system of claim 1 wherein a portion of the channel comprises a recessed portion that extends below a surface of the support structure.

3. The system of claim 2 wherein the substantially rectangular shaped middle portion seal is of a thickness about the size of a non-recessed portion of the channel.

4. The system of claim 2 wherein the seal is of a narrow thickness and is configured to be mounted on an outer edge of a non-recessed portion of the channel.

5. The system of claim 4 wherein the seal further comprises a plurality of cylindrical-like structures located on the inside surface of the seal and used for mounting the seal on the outer edge of the non-recessed portion of the channel.

6. The system of claim 5 wherein one of the plurality of cylindrical-like structures is configured to attach to an alignment structure of the support structure.

7. The system of claim 1 wherein the substantially rectangular shaped middle portion of the seal is attached to the support structure at one end of the channel.

8. The system of claim 1 wherein the seal comprises a plug to seal the one end of the channel in an air-tight or non-airtight manner.

9. The system of claim 1 wherein the seal further comprises end portions on each end of the middle portion.

10. The system of claim 9 wherein at least one of the end portions is tapered.

11. The system of claim 10 wherein at least one of the tapered end portions comprises a concave surface.

12. The system of claim 1 wherein an end portion of the substantially rectangular shaped middle portion is adjacent to a flexible donut shaped object located on an alignment pin.

13. The system of claim 1 wherein the middle portion has a notch formed lengthwise along the middle portion.

14. The system of claim 1 wherein the middle portion includes a rectangular shaped body section and a flat section protruding from the bottom of the rectangular shaped body section.

15. A system for semiconductor device testing comprising:
    a device tester comprising a support plate, the support plate comprising a first substantially rectangular platform having a first group of test pins, and a second substantially rectangular platform having a second group of test pins, wherein the first and second substantially rectangular platforms are located such that a channel is formed between them;
    a board positioned above the first and second substantially rectangular platforms and enclosing the channel;

a dry air source configure to provide dry air to the enclosed channel; and two substantially rectangular shaped plugs; and wherein each rectangular-shaped plug is configured to close at least part of one end of the enclosed channel such that the dry air is substantially contained in the enclosed channel.

16. The system of claim 15 wherein each substantially rectangular shaped plug has two layers.

17. The system of claim 16 wherein the enclosed channel comprises a recessed portion at a bottom of the enclosed channel and each rectangular-shaped plug is attached to a non-recessed portion of the bottom of the enclosed channel.

18. The system of claim 17 wherein each rectangular-shaped plug is located at the outer edge of the non-recessed portion of the bottom of the enclosed channel.

19. A tester system for semiconductor device testing comprising:

a base having a support plate and a channel between a first and second potion of the support plate, the first portion having a first sealing ring and a first group of compressible test pins therein and the second portion having a second sealing ring and a second group of compressible test pins therein;

a load board mounted over the first and second sealing rings and including first and second pluralities of test pin contacts formed on a first surface facing the base, and a device test socket mounted on a second surface facing away from the base, wherein the device test socket is located between the first and second groups of test pin contacts, and wherein when the first plurality of test pin contacts abut the tips of the first group of compressible test pins, and the second plurality of test pin contacts abut the tips of the second group of compressible test pins, the channel is enclosed; and a boxed shaped structure having at least two ends narrowed in at least one dimension, the box shaped structure for closing one end of the enclosed channel.

20. The system of claim 19 wherein the boxed shaped structure comprises a printed circuit board material first layer and a sealing foam second layer, the second layer attached to the first layer.

* * * * *